(12) United States Patent
Bradl et al.

(10) Patent No.: US 6,459,296 B2
(45) Date of Patent: Oct. 1, 2002

(54) METHOD, SYSTEM AND METHOD OF USING A COMPONENT FOR SETTING THE ELECTRICAL CHARACTERISTICS OF MICROELECTRONIC CIRCUIT CONFIGURATIONS

(75) Inventors: Stephan Bradl, Köfering; Oliver Gehring, Dresden; Olaf Heitzsch, Coswig, all of (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/916,668

(22) Filed: Jul. 26, 2001

(30) Foreign Application Priority Data

Jul. 26, 2000 (DE) .......................................... 100 37 447

(51) Int. Cl.[7] .......................................... H03K 19/177
(52) U.S. Cl. ............................ 326/37; 326/329; 326/39
(58) Field of Search ..................................... 326/37–41

(56) References Cited

U.S. PATENT DOCUMENTS

| 5,107,146 | A | * | 4/1992 | El-Ayat ........................ 307/465 |
| 5,196,740 | A | * | 3/1993 | Austin ......................... 307/303 |
| 5,563,526 | A | | 10/1996 | Hastings |
| 5,847,996 | A | | 12/1998 | Guterman et al. |
| 6,246,258 | B1 | * | 6/2001 | Lesea ........................... 326/39 |

OTHER PUBLICATIONS

Tietze/Schenk: "Halbleiterspeicher" [semiconductor memory], 11th edition, pp. 746–765.

* cited by examiner

Primary Examiner—Michael Tokar
Assistant Examiner—Vibol Tan
(74) Attorney, Agent, or Firm—Laurence A. Greenberg; Werner H. Stemer; Ralph E. Locher

(57) ABSTRACT

The electrical characteristic of a microelectronic circuit configuration that has at least one analog electronic unit is set. In a configuration step, by feeding and/or extracting electrical charge, the analog electronic unit is put into a state which permanently determines the analog electrical characteristics of the unit. In particular, the floating gate of an EEPROM cell is charged up to a freely selectable charge value lying within a continuous range.

13 Claims, 2 Drawing Sheets

METHOD, SYSTEM AND METHOD OF USING A COMPONENT FOR SETTING THE ELECTRICAL CHARACTERISTICS OF MICROELECTRONIC CIRCUIT CONFIGURATIONS

BACKGROUND OF THE INVENTION

Field of the Invention

The invention relates to a method and to a system for setting the electrical characteristics of a microelectronic circuit configuration in which the circuit configuration has at least one analog electronic unit. The invention also relates to using a microelectronic circuit element for setting the characteristics of such a circuit configurations.

The design of microelectronic circuit configurations, in particular those circuit configurations which have both analog electronic units and digital units, is one of the most demanding tasks in current electrical engineering. Although simulations are normally carried out before the production of the circuit configurations, a fault-free design cannot be guaranteed. The consequences of faulty designs are, inter alia, the time-consuming and costly search for errors, the repeated production of expensive masks for the production of the microelectronic circuit configurations and the redesign of the circuit configuration.

In microelectronic circuit configurations, programmable logic devices (PLDs) have been used for some time. The PLDs include, amongst others, PLAs (programmable logic arrays), PAL (programmable array logic) and FPGAs (field programmable gate arrays). The common factor to PLDs is that digital units can be linked differently in order to process digital information, that is to say they can be programmed. In particular, FPGAs in this way permit the prior hardware checking of designs of digital circuit configurations. FPGAs comprise a large number of configurable logic blocks and a network of lines, which can provide virtually any required pattern of connections between the blocks. For this purpose, switches, which can be actuated by external signals, are available at the crossing points of the lines.

U.S. Pat. No. 5,563,526 discloses a programmable circuit configuration having both digital and analog circuit units. In addition to the possibilities already offered by FPGAs, the analog characteristics of the analog units can also be changed, and the analog units can be linked with one another and/or with the digital units in different ways.

For example, U.S. Pat. No. 5,563,526 discloses an analog unit which can be programmed both as a comparator and as an operational amplifier. To this end, the analog unit has a programmable switch which, when it is closed, permits operation as an operational amplifier and, when it is open, permits operation as a comparator.

As in the case of the FPGAs, however, it is not possible for the analog electrical characteristics of the components of such a unit to be changed, for example, the gain of a transistor in the amplifier circuit or the resistance of a component. The possibilities of employing designs of mixed microelectronic circuit configurations is therefore restricted to a few applications, which have to be taken into account in advance in the circuit configuration.

SUMMARY OF THE INVENTION

It is accordingly an object of the invention to provide a method and a system for setting the electrical characteristics of a microelectronic circuit configuration which overcomes the above-mentioned disadvantageous of the prior art apparatus and methods of this general type. In particular, it is an object of the invention to make it possible to set analog electrical characteristics of the circuit configuration continuously, that is to say to be able to select from a continuous value range. It is a further object of the present invention to provide a method of using a microelectronic circuit element with which the aforementioned objective may be achieved.

With the foregoing and other objects in view there is provided, in accordance with the invention, a method of setting electrical characteristics of a microelectronic circuit configuration, which includes a step of providing a microelectronic circuit configuration having at least one analog electronic unit. In a configuration step, an electrical charge is moved in a manner selected from the group consisting of feeding the electrical charge and extracting the electrical charge and thereby puts the analog electronic unit into a state that permanently determines analog electrical characteristics of the analog electronic unit so that the circuit configuration can be operated using these analog electrical characteristics. The configuration step is performed at a time selected from the group consisting of a time before operating the circuit configuration and a time during operation of the circuit configuration.

In other words, in a configuration step before or during the operation of the circuit configuration, by feeding and/or extracting electrical charge, the analog unit is put into a state which permanently determines the analog electrical characteristics of the unit, so that the circuit configuration can be operated using these characteristics. As a result, the charge state of the analog unit, in particular the charge state of a region which is electrically insulated during operation, is set to a charge value which lies within a continuous s value range. In this way, in turn, the electrical field strength is defined which originates from the region that is generally charged up. In microelectronic components, this means exerting an influence on the electrical characteristics of adjacent regions, so that the adjacent regions belonging to the analog unit have specific characteristics which depend on the field strength. The circuit configuration can be operated using these specific characteristics.

In accordance with an added feature of the invention, the analog unit has a microelectronic circuit element with a floating gate. In the configuration step, the floating gate is charged up to any desired charge value lying within a continuous value range. The charge state of the floating gate then determines, for example, the threshold voltage at which a current flow between two associated electrodes can take place when an electrical voltage is applied to the electrodes.

In accordance with an additional feature of the invention, at least one of the analog characteristics of the analog unit, in particular a threshold voltage of a transistor with a floating gate, is measured and, if necessary, is corrected during and/or after the feeding or extraction of the electrical charge. The measurement can be carried out during the configuration step or after it. In any case, this permits the set state to be checked and, if necessary, to be corrected.

In accordance with another feature of the invention, the circuit configuration has means for connecting and/or disconnecting circuit elements, for example switching elements having one or more switching transistors. This corresponds to the conventional concept which is applied in FPGAs. In combination with the present invention, this results in a large number of possible ways of configuring a circuit configuration with an analog unit. In the extreme case, individual components are available whose analog characteristics can be set in accordance with the invention, and sufficient switching means and line connections are provided in order to be able to set virtually any desired circuit. The significant advantage as compared with conventional concepts is that only a limited, comprehensible number of circuit elements of a specific type have to be provided, since it is certain that the analog characteristics of the circuit elements can be set.

The method can be used with particular advantage in the design of microelectronic circuit configurations. This is because, in the case of a configurable microelectronic circuit configuration the invention permits analog electrical characteristics to be set reversibly and the circuit design to be tested. In the event of a successful test, a further circuit configuration having the same, but unchangeable, analog characteristics can then be produced, for example in mass production. Design errors in the further circuit configuration can therefore be avoided.

As an example of a component whose analog characteristics can be configured in the manner described, mention should be made here of a circuit element having a floating gate, in particular a FLOTOX (floating gate tunneling oxide) element. In a FLOTOX, the charging or discharging of the floating gate is effected by using the tunnel effect. To this end, it is most often the case that a voltage which is unusually high as compared with the operation of the component is applied, so that charge carriers can tunnel with a high probability through the isolating regions surrounding the floating gate. However, the invention is not restricted to the use of the tunnel effect. Instead, other methods for changing the charge state of a floating gate, known from the prior art, can be applied.

With the foregoing and other objects in view there is also provided, in accordance with the invention, a system that includes a microelectronic circuit configuration having an analog electronic unit. The analog electronic unit has an electrically insulated region with an electrical charge state that determines the analog electrical characteristics of the analog electronic unit. The configuration also includes a setting device for setting the electrical charge state to a freely selectable charge value lying within a continuous value range.

With the foregoing and other objects in view there is also provided, in accordance with the invention, a method of using a microelectronic circuit element to set analog characteristics of a circuit configuration. The method includes steps of: providing a circuit configuration having at least one analog electronic unit; providing a microelectronic circuit element having a floating gate for setting analog characteristics of the circuit configuration; and changing a charge state of the floating gate to set the analog characteristics of the circuit configuration.

Other features which are considered as characteristic for the invention are set forth in the appended claims.

Although the invention is illustrated and described herein as embodied in a method, a system, and a method of using a component for setting the electrical characteristics of microelectronic circuit configurations, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
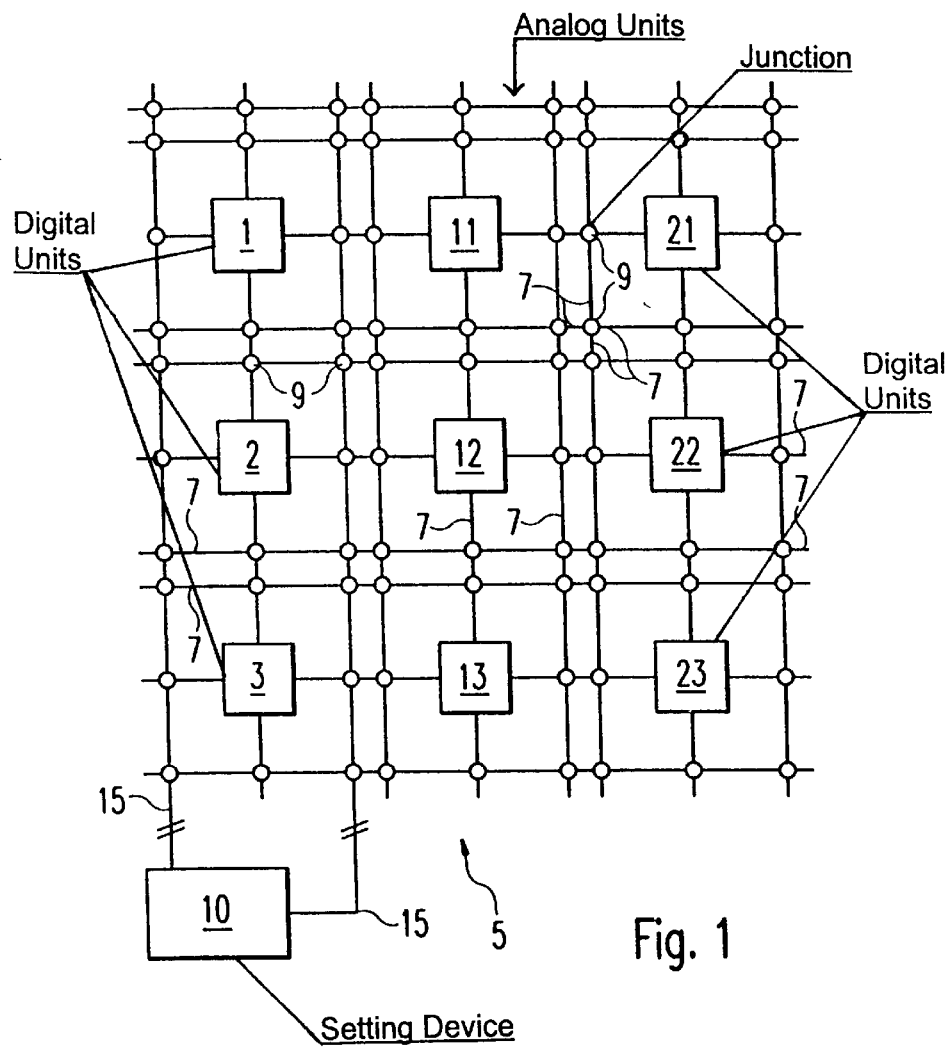
FIG. 1 shows a circuit configuration and a setting device for setting analog characteristics of the circuit configuration.

Referring now to the figures of the drawing in detail and first, particularly, to FIG. 1 thereof, there is shown a circuit configuration 5 having a plurality of analog and digital units. Digital units belonging to the circuit configuration 5 are designated by the reference symbols 1, 2, 3 and 21, 22, 23. The digital units are used to process binary information. Binary signals are therefore present on their inputs and outputs during operation. Analog units belonging to the circuit configuration 5 are designated by the reference symbols 11, 12, 13. The analog units 11, 12, 13 can optionally also have circuit elements which can process digital information.

The digital and analog units 1 to 3, 11 to 13 and 21 to 23 are surrounded by a network of electrical lines, which are designated by way of example with the reference symbol 7. The network of electrical lines 7 has a large number of junctions, which are designated by way of example by the reference symbol 9. There are switching elements (not specifically illustrated) at the junctions 9 and these switching elements permit each of the four electrical lines 7 positioned at the junction either to be connected electrically to one another or insulated electrically from one another. The switching elements can be driven by means which are not illustrated, so that the switching state can be set externally. Embodiments of such switching elements can be taken, for example, from U.S. Pat. No. 5,563,536.

A setting device 10 is connected electrically to the circuit configuration 5. The setting device 10 can be connected to the network of electrical lines 7 by connecting lines 15. In addition, by controlling the switching elements appropriately at the junctions 9, the setting device 10 can be connected to each of the units 1 to 3, 11 to 13 and 21 to 23. The setting device 10 preferably has not just the two connecting lines 15 shown schematically, but rather has a large number of connecting lines, which permit any possible setting of analog and digital characteristics to be performed. In particular, a number of setting operations can be performed simultaneously.

Figure 2:
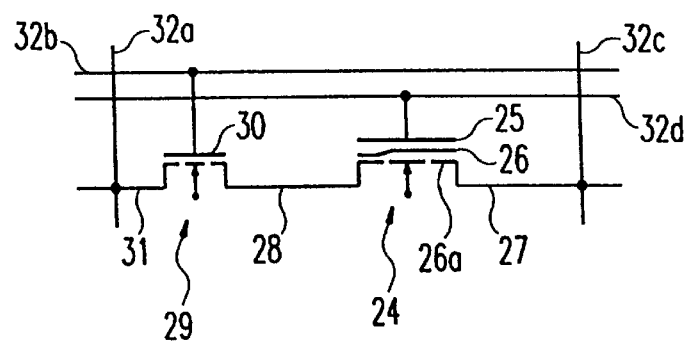
FIG. 2 shows a transistor having analog characteristics that can be set with a switching transistor.

FIG. 2 shows a transistor 24, which has a control gate and a floating gate 26. The source and drain of the transistor 24 are connected electrically by a source line 27 and a drain line 28. The drain line 28 connects the drain of the transistor 24 to the source of a switching transistor 29, via which the transistor 24 can be connected electrically to a connecting line 32a. The source of the transistor 24 is permanently electrically connected to a connecting line 32c. The control gate 25 is connected to a connecting line 32d. In addition, FIG. 2 also shows a connecting line 32b, which is connected to a control gate 30 of the switching transistor 29. The electrical connection between the drain of the switching transistor 29 and the connecting line 32a is produced by a drain line 31.

The combination of the transistors 24, 29 equates with the construction of a digital EEPROM (electrically erasable programmable read only memory) cell which, as is known, is used for storing digital information. The illustration in FIG. 2 is to be understood as schematic. The switching transistor 29 and the transistor 24 do not have to be separated physically from each other, as could be gathered from FIG. 2. Instead, modern, compact designs of EEPROM cells are known which have a plurality of gates located partially one above another, so that only low currents are necessary in order to charge and discharge the floating gate. One example of such an EEPROM cell is described in U.S. Pat. No. 5,847,996. The invention is not restricted to transistors which occur in EEPROM cells. Instead, use can also be made, for example, of semiconductor components with a floating gate but with more than two semiconductor regions which are electrically accessible from outside.

In a similar way to that known from the prior art, the transistor 24 (FIG. 2) is configured with regard to its analog electrical characteristics. For example, an electrical voltage of 12 V is applied between the control gate 25 and the drain, while the source of the transistor 24 can float freely, that is to say the connecting line 32c is not connected externally.

In one embodiment, the configuration illustrated in FIG. 2 is located in at least one of the analog units 11, 12, 13 shown in FIG. 1. The setting of the charge state of the floating gate 26 can therefore be performed by the setting device 10. In particular, the setting device 10 measures the electrical current flowing into the transistor 24 or out of it via the drain line 28. From this, the charge state of the floating gate 26 can be inferred if the initial state of the floating gate 26 is known. The thing to do, in particular, before beginning the setting operation, is initially to discharge the floating gate 26 as far as is possible.

By charging up the floating gate 26, an influence is exerted not only on static electrical characteristics of the transistor 24, such as threshold voltage and static gain, but also on dynamic characteristics which, for example, are critical for drivers and which are used in many ways in microelectronic circuit configurations. A driver is required to raise and/or lower a voltage signal at its output by a specific amount within a specific time interval. The capability of a driver to complete the voltage change in a specific time, mostly within a few nanoseconds, is referred to as the power of the driver. The power of the driver is an analog characteristic which is dynamic to a great extent and which can be set by setting the charge state of a floating gate.

For example, the analog units 11, 12 of a circuit configuration according to FIG. 1 each have at least one transistor of the type of the transistor 24 according to FIG. 2. An example of a circuit which can be configured from the circuit configuration 5 is shown by FIG. 3 and FIG. 4.

Figure 3:
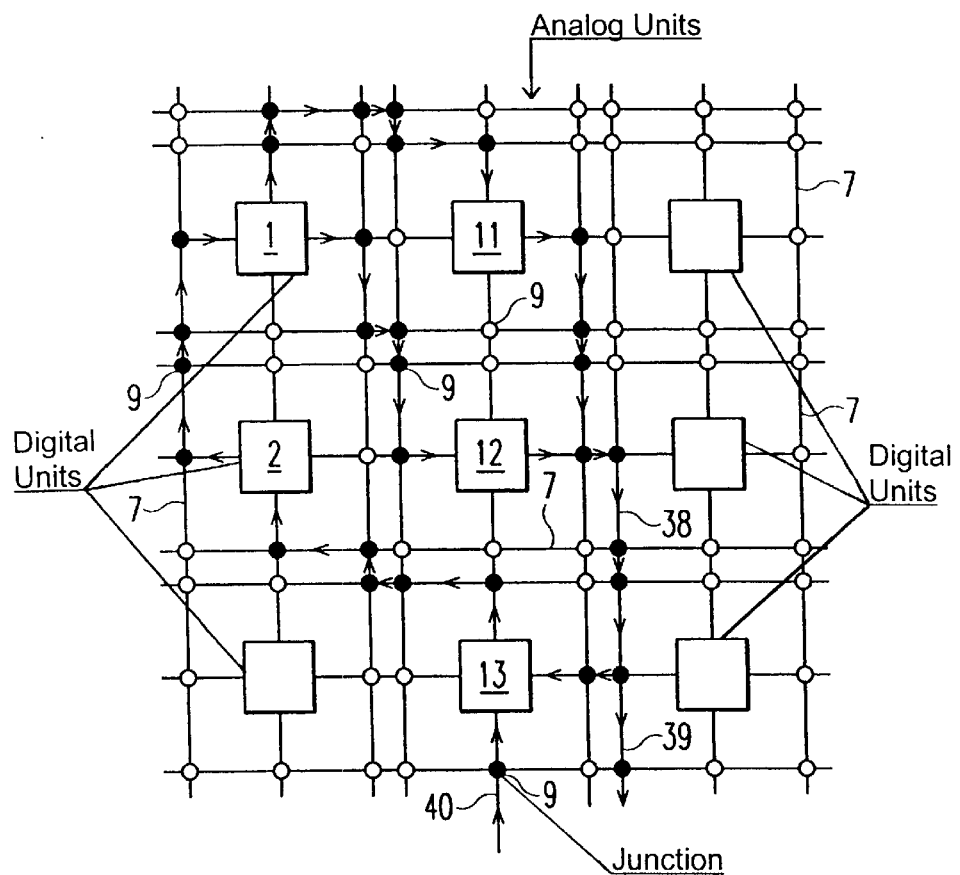
FIG. 3 shows the circuit configuration of FIG. 1 configured in a specific switching state.

The junctions 9 illustrated in FIG. 3 that are filled in darkly, belong to the network of electrical lines 7 and represent that the respective electrical lines 7 connected to the junctions are electrically conductively connected. On the other hand, the junctions 9 which are not filled in darkly represent that the respective electrical lines 7 connected to these junctions are electrically isolated.

Figure 4:
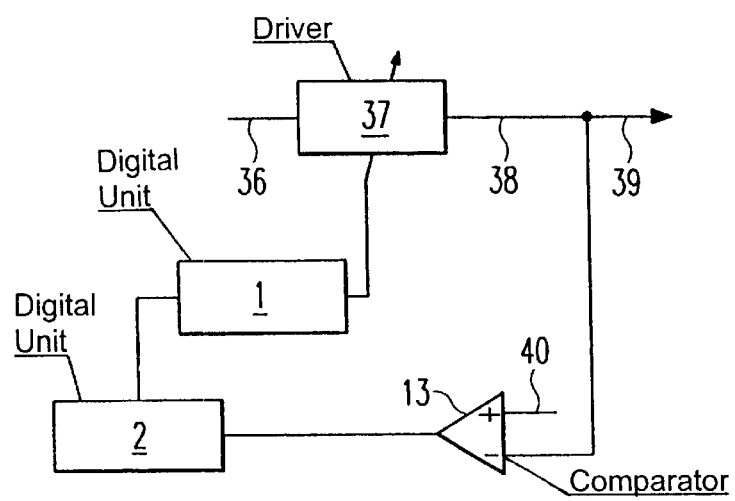
FIG. 4 shows a circuit diagram which corresponds to the switching state shown in FIG. 3.

The circuit state shown in FIG. 3 corresponds to that in FIG. 4. A driver 37 (FIG. 4) has the analog units 11, 12 each having a transistor 24 whose analog characteristics can be set. The power of the adjustable transistor in the analog unit 11 and the power of the transistor in the analog unit 12 are set in advance, by using the setting device 10, such that the power of one transistor is half as great as the power of the other transistor. This permits a control circuit for controlling the power of the driver 37, which permits the driver power to be set in equidistant steps by using a binary control system. The function is described below.

As can be seen from FIG. 3, the two analog units 11, 12, and therefore the two transistors, are connected in parallel. At a driver output 38, it is therefore possible to tap off the driver output signal which is generated on the basis of the total power of the driver 37. The individual powers of the two transistors add to form the overall power of the driver 37. The circuit described permits the two transistors to be enabled or blocked individually by means of binary signals. Since the power of one transistor is half as great as the power of the other transistor, the result is three states for the driver power, if the driver is activated at all. The lowest driver power corresponds to the power of the weaker transistor. The greatest driver power corresponds to the state when both transistors are activated. These three power states each differ from an adjacent power state by one power value which corresponds to the power of the weaker transistor.

In this description, for simplicity only two transistors connected in parallel were mentioned. In general, a driver of this type composed of parallel transistors can have more than two part-drivers, whose powers are stepped in the same way, so that the next most powerful driver in each case has twice the power. For example, using five part-drivers of this type, the driver power can be set to 31 equidistant power values.

The way in which the driver power regulation functions is as follows: The driver output signal present on the driver output 38 is fed to the inverting input of a comparator 13'. The comparator 13' corresponds to the analog unit 13 of the circuit configuration 5. The noninverting input of the comparator 13' is connected via one of the junctions 9 to a reference voltage connection 40, on which there is a reference voltage. This reference voltage is a measure of the desired driver power. Depending on whether the desired driver power is actually reached, is not reached or is exceeded, the time response of the output signal output to the digital unit 2 by the comparator 13' is different. The digital units 1, 2, have been previously configured to evaluate the output signal from the comparator 13' and to output a corresponding actuating signal to the analog units 11, 12. In this way, a specific combination of the transistors is enabled, so that the power of the driver 37 is set. When the next trigger signal enters the driver input 36 (FIG. 4), the driver 37 then exhibits the dynamic response corresponding to the set driver power.

A further exemplary embodiment of a circuit configuration which can advantageously be configured in terms of its analog characteristics is a voltage amplifier circuit. In this case, one or more gain factors and/or offset values of the amplifier circuit can be set. It is therefore possible for a universally employable amplification module to be produced which merely has to be configured for the respective intended use. In particular, a setting device is also provided on a common chip that carryies out the configuration and that is capable of being controlled externally by control commands. Using the control commands, for example from a control computer, the respectively desired configuration can then be achieved.

Applications of such and other circuit configurations occur, for example, in the field of the measurement of physical variables, such as temperature or the moisture content of air. In this case, an analog measurement function can be performed by an analog unit configured for the application. At the same time, a digital counter function (for example for integrating a measured heat output over time) can be performed by a digital unit in the same circuit configuration.

Another possible application lies in the field of digital or analog filter circuits, in particular for hi-fi acoustic devices, hearing aids, graphic equalizers, digital media, for example mobile telephones, digital television and radio. In each case, in particular a limiting frequency of the filter circuit can be set variably by setting analog electrical characteristics in accordance with the invention.

Yet another application relates to converting analog signals into digital signals and/or vice versa. For example, the threshold values of signal strengths which are critical for the conversion can be set variably here with the configuration. This permits the user to change the threshold values later. Alternatively, the threshold values can be preconfigured before delivery to the user. A further field of application in the conversion of signals exists where the linearization of analog signals is required. In this case, uniform sensitivity over the entire analog range may be produced by configuring the analog electrical characteristics. In particular, memory cells which are known per se for storing digital information can be used for storing analog values or for storing more than two discrete values. A specific charge state of such a memory cell is therefore not interpreted either as a "zero" or a "one", but rather is interpreted as one of more than two possible values. For example, in this way any desired parameters fit for use in the A/D conversion or in the D/A conversion can be stored.

A further field of application relates to analog arithmetic units. As compared with digital computation, analog calculation has the advantage that it is not necessary to first digitize the analog values or numbers present. The analog calculation can therefore be carried out in real time or at least virtually in real time. For example, the previously described procedure for storing an analog value or a value which is quasi-analog on the basis of fine discretization can be used. One exemplary embodiment of this is the calculation of a temperature value from the voltage signal from a thermocouple. If the temperature value can lie at any arbitrary point within a large temperature measurement range, the mathematical function that can be used to convert the measured voltage value into a temperature value is expressed by a polynomial of a relatively high order, for example by a fourth order polynomial. It is therefore necessary to take into account five constants in the mathematical function. These five constants are each stored in a memory cell, so that an analog arithmetic unit can read and process the values of the constants directly. Computing time can therefore be saved as compared with digital computing units. This is particularly advantageous when—as in the case of measuring temperature values during the production of semiconductor components—a large number of temperature values have to be calculated at short time intervals. Because of the faster calculation, a more rapid reaction to temperature fluctuations is possible. As a result, therefore, the dead time of a temperature control system can be shortened considerably. This ultimately leads to greater constancy of the temperature over time and therefore, inter alia, to fewer rejects in the semiconductor production.

In the case of the analog arithmetic unit, an analog comparator circuit is used in particular for processing the analog stored values and the measured values. This permits the decision to be made as to whether a measured value and/or an intermediate value calculated from it is greater or less than a reference value. In this way, the analog calculated result can be converted into a corresponding binary signal, which permits further processing in a classical, digital manner. However, the output signals from comparator circuits can also be used for further analog processing of the signal or of the calculated result.

This application is not restricted to the measurement of temperature values. Instead, values from pressure sensors, acceleration sensors, which are used particularly in air bags, gas sensors, in particular for monitoring exhaust gases, and from other measuring sensors can also be evaluated in this way. Further fields of application are in the areas of biometrics, for example the detection of specific structures in the human iris, image recognition in general and in the area of fuzzy logic computation.

As a result of the invention, with little outlay on circuitry, circuit configurations can be operated which can be configured in very different ways. In particular, this makes it possible to test designs of circuit configurations with mixed digital and analog functions in a better way, before mass production of microelectronic circuits with specific characteristics begins.

On the other hand, by means of a "universal" design within a large mass-production series, various applications can be programmed individually.

We claim:

1. A method of setting electrical characteristics of a microelectronic circuit configuration, which comprises:
   providing a microelectronic circuit configuration having at least one analog electronic unit;
   in a configuration step, moving an electrical charge in a manner selected from the group consisting of feeding the electrical charge and extracting the electrical charge and thereby putting the analog electronic unit into a state that permanently determines analog electrical characteristics of the analog electronic unit so that the circuit configuration can be operated using these analog electrical characteristics; and
   performing the configuration step at a time selected from the group consisting of a time before operating the circuit configuration and a time during operation of the circuit configuration.

2. The method according to claim 1, which comprises:
   providing the analog electronic unit with a microelectronic circuit element having a floating gate; and
   in the configuration step, charging the floating gate up to a charge value that can be set as desired and that lies within a continuous value range.

3. The method according to claim 2, which comprises:
   providing the microelectronic circuit element as a transistor;
   measuring a threshold voltage of the transistor and if necessary, correcting the threshold voltage in the configuration step by moving the electrical charge; and
   defining the threshold voltage as one of the analog electrical characteristics.

4. The method according to claim 1, which comprises:
   providing the analog electronic unit with a transistor having a floating gate;
   measuring a threshold voltage of the transistor and if necessary, correcting the threshold voltage in the configuration step by moving the electrical charge; and
   defining the threshold voltage as one of the analog electrical characteristics.

5. The method according to claim 1, which comprises:
   providing the circuit configuration with circuit elements; and
   performing a switching operation selected from the group consisting of electrically connecting selected ones of the switching elements and electrically disconnecting the selected ones of the switching elements and thereby additionally setting the analog electrical characteristics.

6. The method according to claim 1, which comprises:

providing a further circuit configuration having unchangeable analog electrical characteristics that are identical to the analog electrical characteristics of the analog electronic unit; and enabling the analog electrical characteristics of the analog electronic unit to be reversibly set.

7. A system comprising:

a microelectronic circuit configuration including an analog electronic unit, said analog electronic unit having an electrically insulated region with an electrical charge state that determines analog electrical characteristics of the analog electronic unit; and a setting device for setting the electrical charge state to a freely selectable charge value lying within a continuous value range.

8. The system according to claim 7, comprising a device for performing a function selected from the group consisting of measuring the electrical charge state and measuring at least one of the analog electrical characteristics that result from the electrical charge state.

9. The system according to claim 8, comprising a device for processing digital information, said device for processing the digital information switchably connected to said analog electronic unit.

10. The system according to claim 7, comprising a device for processing digital information, said device for processing the digital information switchably connected to said analog electronic unit.

11. A method of using a microelectronic circuit element to set analog characteristics of a circuit configuration, the method which comprises:

providing a circuit configuration having at least one analog electronic unit;

providing a microelectronic circuit element having a floating gate for setting analog characteristics of the circuit configuration; and changing a charge state of the floating gate to set the analog characteristics of the circuit configuration.

12. The method according to claim 11, which comprises providing the microelectronic circuit element as a FLOTOX element.

13. The method according to claim 11, which comprises defining the analog characteristics of the circuit configuration to include a threshold voltage and a voltage amplification behavior.

* * * * *